(12) United States Patent
Sciancalepore et al.

(10) Patent No.: US 10,340,656 B2
(45) Date of Patent: Jul. 2, 2019

(54) SEMICONDUCTOR LASER SOURCE

(71) Applicant: Commissariat A L'Energie Atomique et aux Energies Alternatives, Paris (FR)

(72) Inventors: Corrado Sciancalepore, Lyons (FR); Marco Casale, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 1 day.

(21) Appl. No.: 15/636,869

(22) Filed: Jun. 29, 2017

(65) Prior Publication Data

US 2018/0006427 A1 Jan. 4, 2018

(30) Foreign Application Priority Data

Jun. 30, 2016 (FR) .................................... 16 56174

(51) Int. Cl.
*H01S 5/02* (2006.01)
*H01S 5/022* (2006.01)
(Continued)

(52) U.S. Cl.
CPC .............. *H01S 5/021* (2013.01); *H01S 5/026* (2013.01); *H01S 5/0228* (2013.01);
(Continued)

(58) Field of Classification Search
CPC .. H01S 5/021; H01S 5/02476; H01S 5/02256; H01S 5/02469; H01S 5/3013;
(Continued)

(56) References Cited

U.S. PATENT DOCUMENTS 7,693,361 B2 * 4/2010 Leem ................. G02B 6/12004
372/30
9,507,089 B2 11/2016 Chantre et al.
(Continued)

FOREIGN PATENT DOCUMENTS

FR 3 024 910 A1 2/2016

OTHER PUBLICATIONS

French Preliminary Search Report dated Mar. 30, 2017 in French Application 16 56174, filed on Jun. 30, 2016 (with English Translation of Categories of Cited Documents & Written Opinion).
(Continued)

*Primary Examiner* — Xinning (Tom) Niu
(74) *Attorney, Agent, or Firm* — Oblon, McClelland, Maier & Neustadt, L.L.P.

(57) ABSTRACT

A semiconductor laser source includes a structured layer formed on a substrate made of silicon and having an upper face. The structured layer includes a passive optical component chosen from the group composed of an optical reflector and a waveguide. The component is encapsulated in silica or produced on a silica layer. At least one pad extends from a lower face of the structured layer, making direct contact with the substrate made of silicon, to an upper face flush with the upper face of the structured layer. The pad is produced entirely from silicon nitride, in order to form a thermal bridge through the structured layer. An optical amplifier is bonded directly above the passive optical component and partially to the upper face of the pad in order to dissipate the heat that it generates to the substrate made of silicon.

7 Claims, 2 Drawing Sheets

(51) Int. Cl.
  H01S 5/024    (2006.01)
  H01S 5/042    (2006.01)
  H01S 5/30     (2006.01)
  H01S 5/026    (2006.01)
  H01S 5/183    (2006.01)
  H01S 5/50     (2006.01)

(52) U.S. Cl.
  CPC ...... H01S 5/02252 (2013.01); H01S 5/02256 (2013.01); H01S 5/02469 (2013.01); H01S 5/02476 (2013.01); H01S 5/042 (2013.01); H01S 5/183 (2013.01); H01S 5/3013 (2013.01); H01S 5/50 (2013.01)

(58) Field of Classification Search
  CPC .......... H01S 5/042; H01S 5/0228; H01S 5/50; H01S 5/183; H01S 5/026; H01S 5/02252
  See application file for complete search history.

(56) References Cited

U.S. PATENT DOCUMENTS

| 2003/0020091 | A1* | 1/2003 | Tungare | H01S 5/0261 257/190 |
| 2008/0093622 | A1* | 4/2008 | Li | H01L 21/02381 257/103 |
| 2009/0168821 | A1 | 7/2009 | Fang et al. | |
| 2016/0047986 | A1 | 2/2016 | Chantre et al. | |
| 2016/0094014 | A1 | 3/2016 | Shin et al. | |

OTHER PUBLICATIONS

B. Ben Bakir et al. "Electrically driven hybrid Si/III-V Fabry-Perot lasers based on adiabatic mode transformers", Optics Express, vol. 19, No. 11, 2011, 9 pages.

Matthew N. Sysak et al. "Reduction of hybrid silicon laser thermal impedance using Poly Si thermal shunts", BNSDOCID, 31806882 A, 4 pages.

Matthew N. Sysak et al. "Experimental and theoretical thermal analysis of a hybrid Silicon Evanescent Laser", Optics Express, vol. 15, No. 23, 2007, 6 pages.

Stevan S. Djordjevic et a; "CMOS-compatible, athermal silicon ring modulators clad with titanium dioxide", Optics Express, vol. 21, No. 12, 2013, 11 pages.

Chi Xiong et al. "Low-Loss, Silicon Integrated, Aluminum Nitride Photonic Circuits and Their use for Electro-Optic Signal Processing", Nano Letters, 2012, 7 pages.

* cited by examiner

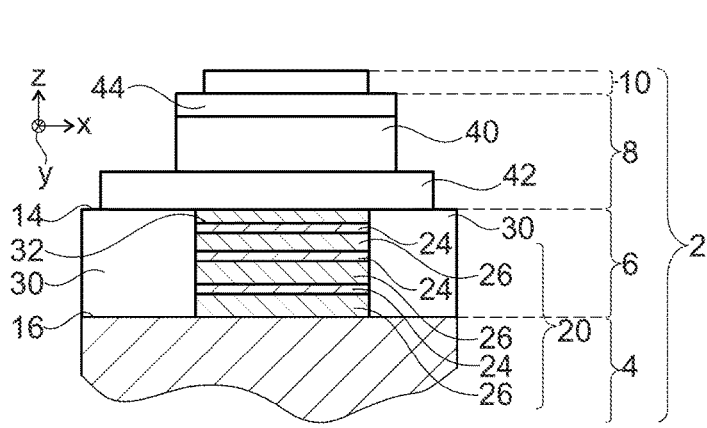
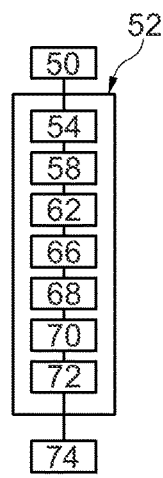
Fig. 1
Fig. 2
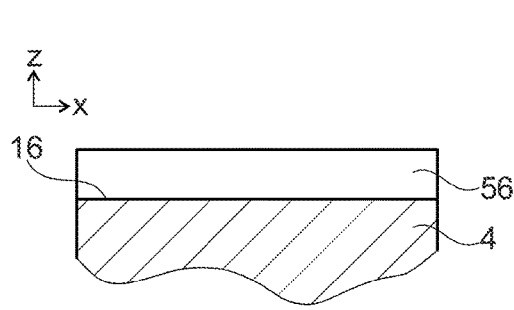
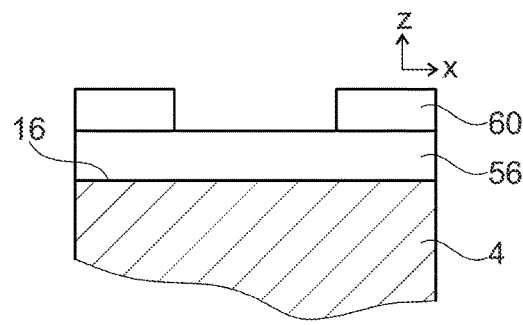
Fig. 3
Fig. 4
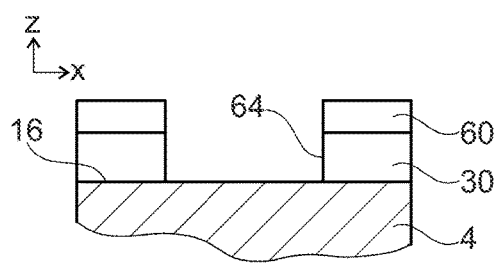
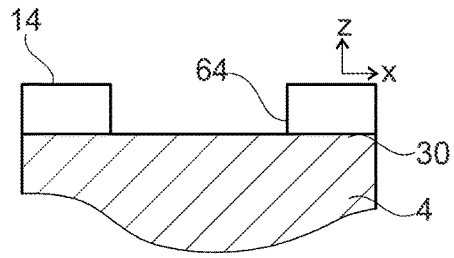
Fig. 5
Fig. 6

SEMICONDUCTOR LASER SOURCE

The invention relates to a semiconductor laser source able to emit at at least one wavelength $\lambda_{Li}$. The invention also relates to a process for manufacturing this laser source.

Known semiconductor laser sources compatible with CMOS technology include an optical amplifier deposited on (or added to) a structured layer including at least one passive optical component. In these known laser sources, the optical amplifier converts some of the electrical power that it consumes into heat. To keep constant emission characteristics and to increase the operating range of the laser source, this heat must be dissipated. Operating range here means a range of temperatures inside of which the emission spectrum of the laser source is almost constant. However, in known laser sources compatible with CMOS technology, the structured layer is a layer of silica ($SiO_2$) in the interior of which, or on which, the passive optical component is manufactured. Thus, the optical amplifier is mechanically insulated from the substrate made of silicon by this structured layer, which is essentially made of silica. However, silica is a poor thermal conductor. By "poor thermal conductor" what is meant here is a material the thermal conductivity at 20° C. of which is lower than or equal to 1.5 W/m/K or 1.3 W/m/K. Thus, in these known laser sources, the optical amplifier is also thermally insulated from the substrate made of silicon. This does not favour the dissipation of the heat.

Moreover, at the present time, silica remains the most practical choice for manufacturing the structured layer because it is easy to deposit and etch with the manufacturing techniques developed for CMOS (complementary metal-oxide-semiconductor) technology. For example, silica is much more practical to deposit and etch than aluminium nitride, which has a refractive index acceptable for encapsulating and producing passive optical components. Specifically, the deposition and etching of aluminium nitride requires special tools to be used, this complexifying the manufacture of the laser source. In contrast, aluminium nitride has a good thermal conductivity. By "good thermal conductivity", what is meant here is a thermal conductivity at 20° C. higher than or equal to 5 W/m/K and, preferably, higher than or equal to 20 W/m/K and therefore much higher than that of silica.

More recently, another solution has been proposed in the following article: Matthew N. Sysak et al., "*Reduction of hybrid silicon laser thermal impedance using poly Si Thermal shunts*", Conference on Optical Fiber Communication-OFC 2011 Collocated National Fiber Optic Engineers Conference OFC/NFOEC, 2011, pages 15041. This article is designated by the abbreviation Sysak2011 below.

More precisely, this article describes a laser source including:
  a substrate made of silicon extending mainly in a plane called the "plane of the substrate";
  a structured layer formed on an upper face of the substrate made of silicon and having an upper face on the opposite side to the substrate made of silicon, this structured layer including:
a passive optical component chosen from the group composed of an optical reflector and a waveguide, this passive optical component being encapsulated in silica or produced on a silica layer; and
at least one pad extending from a lower face, making direct contact with the substrate made of silicon, to an upper face flush with the upper face of the structured layer, this pad being made entirely from a material the thermal conductivity at 20° C. of which is higher than the thermal conductivity at 20° C. of silica, in order to form a thermal bridge through the structured layer; and
  an optical amplifier made of III-V material able, when it is supplied with power, to amplify the optical signal of wavelength $\Delta_{Li}$ that passes through it, this optical amplifier being bonded directly, by direct bonding, to the upper face of the structured layer above, in a direction perpendicular to the plane of the substrate, the passive optical component so that the optical signal amplified by the optical amplifier is reflected or guided by this passive optical component, this optical amplifier also being bonded directly, by direct bonding, at least partially to the upper face of the pad in order to dissipate the heat that it generates to the substrate made of silicon.

Direct bonding is known in French as "collage direct" or "collage moléculaire". It is a question of bonding achieved between two materials without the presence of any additional material such as a polymerizable adhesive. At low temperatures, the bonding force is essentially due to van der Waals forces. After an anneal at more than 150° or 400° C., covalent bonds appear between the bonded faces and the bonding force is then much higher.

In the article Sysak2011, the pad made of polysilicon has a thermal conductivity at 20° C. of about 30 W/m/K. Since this pad makes direct contact on the one hand with the optical amplifier and on the other hand with the substrate made of silicon, it forms a thermal bridge that passes through the structured layer and that promotes dissipation of the heat of the optical amplifier to the substrate made of silicon. In addition, the solution proposed in the article Sysak2011 is advantageous in that silica may still be used to produce the passive optical component.

However, as comparison of the graphs of FIG. 1 of this article shows, for a given bias current and a given operating temperature, the output power of the laser source that includes the pad made of polysilicon is lower. In other words, because of the integration of the pad made of polysilicon, the laser source consumes more current to deliver the same power. Integration of pads made of polysilicon therefore has an impact on the optical behaviour of the source.

Prior art is also known from:
  US 2009/168821 A1;
  US 2016/047986 A1; and
  US 2016/094014 A1.

The invention aims to remedy this drawback while preserving the advantages of the laser source described in the article Sysak2011. One of its subjects is therefore a laser source in which the pad is produced from silicon nitride ($Si_3N_4$).

In the current state of knowledge, it is assumed that the increase in optical losses when the pad made of polysilicon is used to dissipate heat to the substrate made of silicon originates in part from the fact that the bonding between the optical amplifier and the upper face of this pad has unsuitable properties. For example, it is suspected that the upper face of the pad made of polysilicon is rough, and that this lowers the bonding force between the optical amplifier and the upper face of the structured layer.

The claimed laser source remedies this problem by replacing the polysilicon with silicon nitride. Currently, one hypothesis allowing the good results obtained to be explained is the following: unlike polysilicon, the disparity in the size of the grains in silicon nitride is much smaller. Thus, following identical polishing, the upper face of the silicon-nitride pad is much smoother and less rough than the upper face of a polysilicon pad. Therefore, the quality of the direct bond between the optical amplifier and the upper face of the pad made of silicon nitride is better. This leads to a decrease in optical losses with respect to the case where the pad is produced from polysilicon. In addition, given that the thermal conductivity of silicon nitride is similar to that of polysilicon, the dissipation of heat from the optical amplifier to the substrate made of silicon is as effective as in the laser source described in the article Sysak2011.

As in the solution proposed in the article Sysak2011, the use of the silicon-nitride pad allows the passive optical component to optionally still be manufactured using silica. Thus, this laser source may be manufactured using the same techniques as those developed for CMOS technology. The claimed laser source therefore has the same advantages as those described in the article Sysak2011.

Lastly, use of the nitride has a major advantage with respect to the manufacture of the heat-dissipating pads. Specifically, this material is harder than silica and silicon. The pad made of silicon nitride may thus in addition play the role of a stop layer during the polishing of the upper face of the structured layer. Thus, the polishing is unable to affect the passive optical component of the structured layer.

Embodiments of this laser source may include one or more of the features of the dependent claims.

These embodiments of the laser source furthermore have one or more of the following advantages:

The presence of a film made of silica located above the passive optical component and that is flush with the upper face of the structured layer improves the direct bond between the optical amplifier and this structured layer with respect to the case where a zone is left empty as in the laser source of the article Sysak2011. This therefore further decreases the optical losses of the claimed laser source.

Another subject of the invention is a process for manufacturing the claimed laser source.

Embodiments of the manufacturing process may furthermore have the following advantage:

Given that silicon nitride is harder than silica and silicon, the pad made of silicon nitride allows the polishing to be stopped at precisely the desired height, thereby preventing any excessive polishing liable to damage the passive optical component.

The invention will be better understood on reading the following description, which is given merely by way of nonlimiting example and with reference to the drawings, in which:

FIG. 1 is a schematic illustration, in vertical cross section, of a vertical cavity surface emitting laser (VCSEL) laser source that emits vertically (perpendicular to the substrate);

FIG. 2 is a flowchart of a process for manufacturing the laser source of FIG. 1;

FIGS. 3 to 9 are schematic illustrations, in vertical cross section, of various steps of manufacture of the laser source during the implementation of the process of FIG. 2;

In these figures, the same references are used to reference the same elements. In the rest of this description, features and functions that are well known to those skilled in the art are not described in detail.

Figure 7:
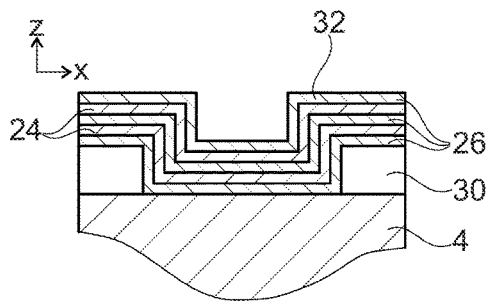

A preferred example embodiment will now be described in the particular case of a vertically emitting laser source produced on a silicon substrate using technologies compatible with CMOS (complementary metal-oxide-semiconductor) technology.

FIG. 1 shows a laser source 2 of the type known as a vertical cavity surface emitting laser (VCSEL) laser diode. The architecture and general operation of such a laser source is well known and only the details required to understand the invention are described here. Such a laser source emits a coherent optical signal at a wavelength $\lambda_{Li}$ typically comprised between 1250 nm and 1650 nm.

In FIG. 1, the laser source 2 is shown in vertical cross section along a vertical plane XZ. In this figure and the following figures, the vertical direction is represented by the Z direction of an orthogonal coordinate system XYZ. The X and Y directions are the horizontal directions. Below, in this text, terms such as "upper", "lower", "top", "bottom", "above", and "below" are defined with respect to the Z direction. In FIG. 1 and the following figures, the various elements of the laser source are not shown to scale to improve the legibility of these figures.

The laser source 2 includes, from bottom to top:
a bulk silicon substrate 4 that mainly extends in a horizontal plane called the "plane of the substrate";
a structured layer 6 deposited directly on the substrate 4;
an optical amplifier 8 deposited directly on the structured layer 6; and
an upper reflector 10 deposited on the optical amplifier 8.

In this description, the expression "layer made of material X" or "produced from material X" means that the layer or element is composed of more than 95% or 98% by weight of the material X.

Typically, the thickness of the substrate 4 is larger than or equal to 250 μm or 500 μm. Here, the thickness of the substrate 4 is 725 μm.

The thickness of the layer 6 depends on the wavelength $\lambda_{Li}$. Typically, the thickness of the structured layer 6 is smaller than 2.5 μm. For example, its thickness may be larger than 100 nm or 500 nm. For example, the thickness of the structured layer 6 is equal to 1 μm to within plus or minus 15%. The structured layer 6 extends from a lower horizontal face 16 of the substrate 4 to an upper horizontal face 14 located on the opposite side of the substrate 4.

The structured layer 6 includes one or more passive optical components. Here, one of these passive optical components is a lower reflector 20. The reflector 20 forms with the reflector 10 an optical cavity inside of which the optical signal at the wavelength $\lambda_{Li}$ resonates before being emitted by the laser source 2.

Typically, the reflector 20 is a Bragg mirror or a Bragg grating. It is therefore formed by a stack of, in the Z direction, in alternation, a low-refractive-index layer and a high-refractive-index layer. Here, the reflector 20 is formed from a stack of, in alternation, a layer 24 made of amorphous silicon and a layer 26 made of silica ($SiO_2$). Typically, the thickness of each layer 24, 26 is proportional to the wavelength $\lambda_{Li}$. For example, the thickness of each of these layers 24, 26 is equal to $\lambda_{Li}/(4n_i)$ where $n_i$ is the refractive index of the layer. The number of times that the alternation of the layers 24, 26 is repeated in the stack is between 2 and 4 alternations and a half. Here, to simplify FIG. 1 and the following figures, only a few layers 24 and 26 have been shown.

The structured layer 6 also includes a pad 30 made of stoichiometric silicon nitride ($Si_3N_4$). Here, in a horizontal plane, this pad 30 completely encircles the reflector 20. The pad 30 extends vertically, from a lower face that rests directly on the face 16 of the substrate 4 to an upper face flush with the face 14. Here, the upper face of the pad 30 is contained in the horizontal plane in which the upper face 14 lies.

The pad 30 therefore passes vertically right through the structured layer 6. It will be recalled that the thermal conductivity of silicon nitride at 20° C. is higher than or equal to 24 W/m/K and, generally, equal to 30 W/m/K to within plus or minus 15%. Its thermal conductivity is therefore much higher than the thermal conductivity of silica, which is about 1.3 W/m/K, and substantially equal to that of polysilicon. The pad 30 therefore forms a thermal bridge that directly connects the upper face 14 to the substrate 4 because its thermal resistance is much lower than that of the reflector 20.

The structured layer 6 also includes a film 32 made of silica interposed uniquely between the reflector 20 and the face 14. This film 32 is flush with the face 14. This film 32 forms a buffer able to absorb hydrogen released during the direct bonding of the optical amplifier 8 to the face 14.

Here, the thickness of the film 32 is larger than or equal to 10 nm or 50 nm and, preferably, is comprised between 50 nm and 100 nm or between 75 and 100 nm.

When it is supplied with power, the optical amplifier 8 amplifies the optical signal at the wavelength $\lambda_{Li}$ that resonates in the optical cavity defined by the reflectors 10 and 20. Such an optical amplifier is better known by the acronym SOA (for semiconductor optical amplifier). For this purpose, it includes an active region 40 interposed between a lower electrode 42 and an upper electrode 44.

The active region 40 is formed from one or more quantum wells made of III-V material. For example, the active region 40 is formed from a stack of, in the Z direction, in alternation, layers made of InGaAs and layers made of GaAs.

The electrodes 42 and 44 are for example made of GaAs. The electrode 42 has a doping of opposite sign to the electrode 44. In addition, the width of the electrode 42 in at least one horizontal direction is larger than the width, in the same direction, of the active region 40 and of the electrode 44. Thus, the electrode 42 extends beyond, here in the X direction, two sides of the active region 40. For example, the electrode 42 extends beyond the active region, in the X direction, by at least 10 µm or 30 µm. Here, the electrode 42 extends beyond each side of the active region by 50 µm. In the same way, the electrode 42 extends beyond the active region in the Y direction.

The electrode 42 is bonded directly, by direct bonding, to the upper face 14 above the reflector 20. More precisely, the electrode 42 is bonded directly to the film 32 and to the upper face of the pad 30. Typically, the electrode 42 completely covers the film 32 and extends directly over the upper face of the pad 30 over a distance larger than or equal to 5 µm and, preferably, larger than or equal to 10 µm or 20 µm. Here, the electrode 42 extends over the upper face of the pad 30, on each side of the reflector 20, and in the X and Y directions, over a distance larger than 50 µm.

Electrical interconnects (not shown in the figures) will be brought into direct mechanical contact with the ends of the electrode 42 that extend beyond the active region in order to apply a potential to this electrode 42. Similarly, at least one electrical interconnect (not shown in the figures) will be brought into direct mechanical contact with the electrode 44 in order to apply another potential to this electrode 44. The potential difference applied between the electrodes 42 and 44 allows the active region 40 to be supplied with power.

The reflector 10 is deposited directly on the electrode 44. This reflector 10 has a structure that is similar (for example a photonic crystal) or identical to that already described for the reflector 20.

When the active region 40 is supplied with power, some of the electrical power consumed is converted into heat. Here this heat propagates via thermal conduction through the electrode 42 and the pad 30 to the substrate 4. This thus limits heating of the optical amplifier 8 and limits the temperature drift in the operating properties of the laser source 2. In addition, since the pad 30 is made of silicon nitride and not of polysilicon, the quality of the direct bonding between the optical amplifier 8 and the face 14 is improved, thereby limiting optical losses.

A process for manufacturing the laser source 2 will now be described with reference to FIGS. 2 to 9.

This process starts with a step 50 of providing the substrate 4 made of silicon.

Next, in a step 52, the structured layer 6 is produced directly on the upper face 16 of the substrate 4.

To do this, in an operation 54, a layer 56 (FIG. 3) of silicon nitride is deposited directly on the upper face 16 of the substrate 4. For example, this layer is deposited by the technique known by the acronym LPCVD (for low-pressure chemical vapour deposition). This deposition may optionally be repeated to achieve the thickness required for the layer 56. The thickness of the layer 56 is equal to the thickness of the pad 30.

In an operation 58, a mask 60 (FIG. 4) made of resist is produced on the layer 56. To this end, a resist layer is deposited then some of this layer is removed in the location where a cavity must be etched in the layer 56.

In an operation 62, the layer 56 is etched through the mask 60 in order to form the cavity 64 (FIG. 5) in the layer 56. This cavity 64 passes right through the layer 56. Here, the bottom of the cavity 64 is formed by the upper face 16 of the substrate 4. The unetched portions of the layer 56 then form the pad 30, which extends all the way around the cavity 64.

In an operation 66, the mask 60 is removed (FIG. 6).

In an operation 68, the reflector 20 is produced inside the cavity 64. To do this, the layers 24 and 26 of the reflector 20 are deposited one after the other to form the stack of layers that constitutes this reflector 20 (FIG. 7). The layers 24 and 26 deposited in this operation completely cover the surface of the substrate 4. They therefore extend on either side of the cavity 64. In addition, each layer 24, 26 has, before extending over the bottom of the cavity 64, segments that are substantially parallel to the vertical walls of this cavity 64. These segments improve the operation of the reflector 20 with respect to the case of a reflector devoid of such segments. To simplify FIG. 1, these vertical segments of the layers 24 and 26 have only been shown in FIGS. 7 to 9. In addition, to simplify FIGS. 7 to 9, the number of layers 24, 26 shown in these figures is limited. However, the number of layers 24, 26 deposited in the operation 68 is equal to the number of layers required to form the reflector 20.

In an operation 70, the film 32 made of silica is deposited on the top-most layer 24 of the reflector 20 (FIG. 7). As for the layers 24 and 26, the deposited film 32 completely covers the surface of the substrate 4 and therefore extends horizontally above the pad 30. At this stage, the thickness of the film 32 may be larger than the desired final thickness.

Figure 8:
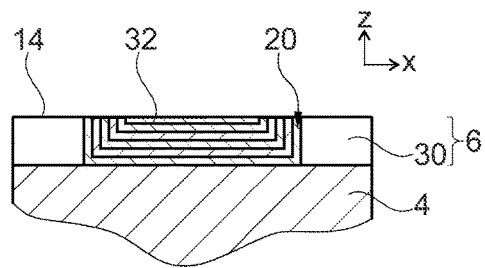

Next, in an operation 72, the upper face of the substrate 4 is polished until the upper face of the pad 30 is reached and left bare (FIG. 8). In this polishing operation, the upper face of the pad 30 is used as a polish stop. As the pad 30 is made of silicon nitride, and as it is therefore much harder than silica, during the manufacture of the laser source 2 the pad 30 makes it possible to guarantee that the thickness of the stack of the reflector 20 and of the film 32 will not be decreased, even accidentally, beyond the thickness of the pad 30. The pad 30 therefore in addition makes it possible to precisely control the thickness of the reflector 20 and of the film 32 that are produced inside the cavity 64.

At this stage, the thickness of the film 32 is equal to the desired final thickness.

The production of the structured layer 6 is terminated at the end of the operation 72 and step 52 finishes.

Figure 9:
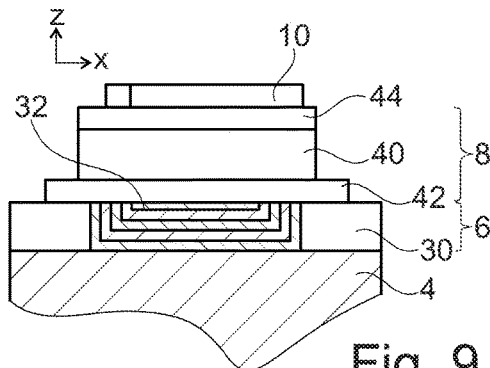

Next, in a step 74, the optical amplifier 8 is bonded, by direct bonding, to face 14 of the structured layer (FIG. 9). More precisely, the electrode 42 is bonded directly to the film 32 and to the upper face of the pad 30. In this step, the film 32 absorbs hydrogen released during this direct bonding, thereby reinforcing the quality and therefore the force of the bonding between the optical amplifier 8 and the structured layer 6.

The reflector 10 may then be deposited on the top of the optical amplifier 8.

The laser source 2 is then obtained.

Figure 10:
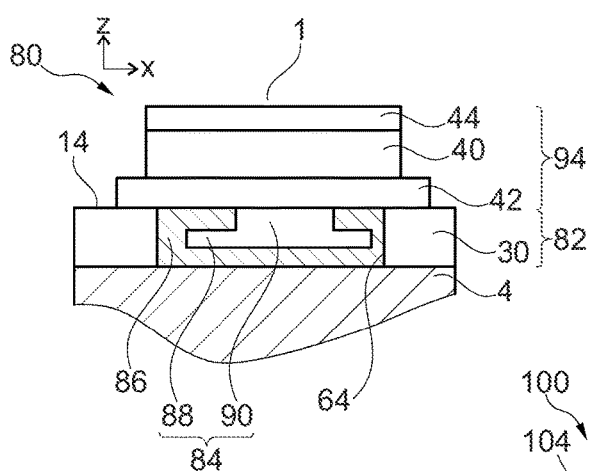
FIGS. 10 and 11 are schematic illustrations, in vertical cross section, of two other possible embodiments of the laser source.

FIG. 10 shows a laser source 80 comprising a horizontal resonant cavity. The general architecture of such a laser source is well known and, for example, described in the following article: B. Ben Bakir et al., "Hybrid Si/III-V lasers with adiabatic coupling", 2011.

In this embodiment, the structured layer 6 has been replaced by a structured layer 82. The layer 82 is identical to the structured layer 6 except that the passive optical component produced inside the cavity 64 is a waveguide 84 made of amorphous silicon at least partially encapsulated in a layer 86 made of silica. The waveguide 84 guides the optical signal along a horizontal optical axis, for example, parallel to the Y direction. In the example embodiment shown, the waveguide 84 has what is called a rib waveguide structure. Here, it is composed of a horizontal slab 88 that extends along the optical axis and of a rib 90 deposited directly on the upper face of the slab 88. Typically, the slab 88 and the rib 90 form a single continuous block of material made of silicon. The rib 90 also mainly extends along the optical axis of this waveguide 84.

Here, the upper face of the rib 90 is flush with the upper face 14 of the structured layer 82. In this embodiment, the silica located on either side of the rib 90 and which is also flush with the face 14 forms a silica film that plays the same role as the film 32 described above.

In the laser source 80, the optical amplifier 8 has been replaced by an optical amplifier 94. The optical amplifier 94 has a structure similar to that of the optical amplifier 8, except that it is in addition formed so as to guide the optical signal at the wavelength $\lambda_{Li}$ horizontally. Here, the reflectors, which are located at the ends of the horizontal cavity of the laser source 80 and, typically, in the waveguide 84, have not been shown. In this embodiment, the waveguide 84 is optically coupled to the optical amplifier 94 by evanescent coupling.

Figure 11:
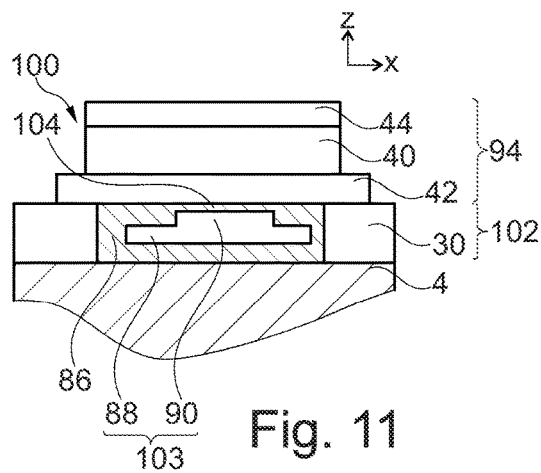

FIG. 11 shows a laser source 100 that is identical to the laser source 80, except that the structured layer 82 has been replaced by a structured layer 102. The structured layer 102 is identical to the structured layer 82 except that the waveguide 84 has been replaced by a waveguide 103. The waveguide 103 is, for example, identical to the waveguide 84, except that it is optically coupled to the optical amplifier 94 by adiabatic coupling and not evanescent coupling. Adiabatic coupling is well known. For example, the reader may refer to the following article for a detailed description of adiabatic coupling: Amnon Yariv et al., "*Supermode Si/III-V hybrid Lasers, optical amplifiers and modulators: proposal and analysis*" Optics Express 9147, vol. 14, No. 15, 23 Jul. 2007. Specifically, in this embodiment, the rib 90 is separated from the upper face 14 by a silica film 104 that is identical to the film 32 described above.

Many other embodiments are possible. For example, what has been described here also applies to any type of laser source in which an active region produced from a III-V material is added by direct bonding to a structured layer including one or more optical components encapsulated in or produced from silica. For example, what has been described applies to distributed Bragg reflector (DBR) laser sources, to distributed feedback (DFB) laser sources, to ring lasers, to mode-locked laser sources or to tunable laser sources.

The passive optical component is not necessarily encapsulated in silica. It may also be produced on a silica layer and inside a cavity filled with air or inside of which a vacuum has been generated. In this case, the vertical walls of the passive optical component do not make direct contact with silica or any other solid material. The pad 30 then passes through the silica layer on which the passive optical component is produced. For example, the vertical walls of the cavity inside of which the passive optical component is housed are those of the pad 30 made of silicon nitride. This situation is in particular encountered when the passive optical component is a waveguide. By way of illustration, this variant corresponds to the embodiment described with reference to FIG. 11 but in which the film 104 and the silica that encircles, in the horizontal direction, the waveguide 103 are omitted so that the waveguide 103 rests only on a silica layer located under it.

The reflector 20 may also be a photonic crystal.

As a variant, if necessary, the substrate 4 made of silicon may be thinned.

In another embodiment, the laser source includes at least two pads or more made of silicon nitride. In this case, the optical amplifier is bonded to the upper faces of these various pads made of silicon nitride.

As a variant, the silica film 32 is omitted. For example, the silica film is replaced by a recessed zone left empty as in the embodiment described in the article Sysak2011.

In another variant, the etching of the cavity 64 is stopped before the substrate 4 made of silicon is reached. In this case, the bottom of the cavity is formed by a thinned portion of the layer 56 made of silicon nitride. In another variant, after the nitride layer 56 has been deposited, the cavity 64 is stopped inside the substrate 4 made of silicon. In this case, the bottom of the cavity 64 is located below the level of the face 16 of the substrate 4.

Many other embodiments of the optical amplifier 8 or 94 are possible. For example, the optical amplifier may be produced as described in the following article: Dimitris Fitsios et al., "*High-gain* 1.3 *μm GaInNAs semiconductor optical amplifier with enhanced temperature stability for all-optical processing at* 10 *Gb/s*", Applied Optics, May 2015 vol. 54, no. 1, 1, Jan. 2015.

The electrodes 42 and 44 may be produced from other III-V materials. For example, they may be produced from InP.

As a variant, the electrode 42 extends directly over the upper face of the pad only in the X or Y direction.

The invention claimed is:

1. A semiconductor laser source able to emit at least one optical signal of wavelength $\lambda_{Li}$, said laser source comprising:

a substrate made of silicon extending mainly in a plane called the "plane of the substrate";

a structured layer formed on an upper face of the substrate made of silicon and having an upper face on the opposite side to the substrate made of silicon, said structured layer comprising:

a passive optical component chosen from a group consisting of an optical reflector and a waveguide, said passive optical component being encapsulated in silica or produced on a silica layer; and at least one pad extending from a lower face, making direct contact with the substrate made of silicon, to an upper face flush with the upper face of the structured layer, said pad being made entirely from a material the thermal conductivity at 20° C. of which is higher than the thermal conductivity at 20° C. of silica, in order to form a thermal bridge through the structured layer; and an optical amplifier made of III-V material configured, when supplied with power, to amplify the optical signal of wavelength $\lambda_{Li}$, said optical amplifier being bonded directly, by direct bonding, to the upper face of the structured layer so that the optical signal amplified by the optical amplifier is reflected or guided by said passive optical component, said optical amplifier being bonded directly, by direct bonding, at least partially to the upper face of the pad in order to dissipate heat generated by the optical amplifier to the substrate made of silicon, wherein the pad is produced from silicon nitride, and the passive optical component is disposed directly below, in a direction perpendicular to the plane of the substrate, the optical amplifier and is narrower than the optical amplifier in a dimension parallel to the plane of the substrate.

2. A semiconductor laser source able to emit at least one optical signal of wavelength $\lambda_{Li}$, said laser source comprising:

a substrate made of silicon extending mainly in a plane called the "plane of the substrate";

a structured layer formed on an upper face of the substrate made of silicon and having an upper face on the opposite side to the substrate made of silicon, said structured layer comprising:

a passive optical component chosen from a group composed of an optical reflector and a waveguide, said passive optical component being encapsulated in silica or produced on a silica layer; and at least one pad extending from a lower face, making direct contact with the substrate made of silicon, to an upper face flush with the upper face of the structured layer, said pad being made entirely from a material the thermal conductivity at 20° C. of which is higher than the thermal conductivity at 20° C. of silica, in order to form a thermal bridge through the structured layer; and an optical amplifier made of III-V material configured, when supplied with power, to amplify the optical signal of wavelength $\lambda_{Li}$, said optical amplifier being bonded directly, by direct bonding, to the upper face of the structured layer, which is above, in a direction perpendicular to the plane of the substrate, the passive optical component, so that the optical signal amplified by the optical amplifier is reflected or guided by said passive optical component, said optical amplifier being bonded directly, by direct bonding, at least partially to the upper face of the pad in order to dissipate heat generated by the optical amplifier to the substrate made of silicon, wherein the pad is produced from silicon nitride, and the laser source comprises a film made of silica of thickness larger than or equal to 10 nm located above at least one portion of the passive optical component and flush with the upper face of the structured layer so that the optical amplifier is also bonded directly to said film made of silica.

3. The laser source according to claim 2, wherein the film made of silica completely covers the passive optical component.

4. The laser source according to claim 2, wherein the passive optical component is an optical reflector including a stack of, in alternation in the direction perpendicular to the plane of the substrate, layers made of silicon and layers made of silica, said stack terminating in the film made of silica that is flush with the upper face of the structured layer.

5. The laser source according to claim 2, wherein the passive optical component is a waveguide that is optically coupled to the optical amplifier through the film made of silica by adiabatic coupling.

6. A process for manufacturing a laser source according to claim 1, wherein the process comprises:

providing a substrate made of silicon extending mainly in a plane called the "plane of the substrate";

producing a structured layer on an upper face of the substrate made of silicon and having an upper face on the opposite side to the substrate made of silicon, said structured layer including:

a passive optical component chosen from the group composed of an optical reflector and a waveguide, said passive optical component being encapsulated in silica or produced on a silica layer; and at least one pad extending from a lower face, making direct contact with the substrate made of silicon, to an upper face flush with the upper face of the structured layer, said pad being made entirely from a material the thermal conductivity at 20° C. of which is higher than the thermal conductivity at 20° C. of silica, in order to form a thermal bridge through the structured layer; and bonding an optical amplifier made of III-V material able, when it is supplied with power, to amplify the optical signal of wavelength $\lambda_{Li}$ that passes through it, said optical amplifier being bonded directly, by direct bonding, to the upper face of the structured layer above, in a direction perpendicular to the plane of the substrate, the passive optical component so that the optical signal amplified by the optical amplifier is reflected or guided by said passive optical component, said optical amplifier also being bonded directly, by direct bonding, at least partially to the upper face of the pad in order to dissipate the heat that it generates to the substrate made of silicon, wherein, during the production of the structured layer, the pad is produced from silicon nitride.

7. The process according to claim 6, wherein the production of the structured layer comprises:

etching a cavity into a layer made of silicon nitride, which layer is deposited directly on the substrate made of silicon, said etching leaving behind at least one pad made of silicon nitride that extends around the cavity;

producing the passive optical component in the interior of said cavity;

depositing a silica film that covers both the upper face of the pad made of silicon nitride and the passive optical component produced in the cavity; and polishing the upper face of the structured layer using the upper face of the pad as a polish stop.

* * * * *